United States Patent
Chou et al.

(10) Patent No.: US 6,639,839 B1
(45) Date of Patent: Oct. 28, 2003

(54) SENSING METHOD FOR EEPROM REFRESH SCHEME

(75) Inventors: Ming-Hung Chou, Hsinchu (TW); Chia-Hsing Chen, Hsinchu (TW)

(73) Assignee: Macronix International Co., Ltd., Taiwan (CN)

(*) Notice: Subject to any disclaimer, the term of this patent is extended or adjusted under 35 U.S.C. 154(b) by 0 days.

(21) Appl. No.: 10/151,150

(22) Filed: May 21, 2002

(51) Int. Cl.[7] .................. G11C 16/06; G11C 16/04
(52) U.S. Cl. ................... 365/185.25; 365/185.2; 365/185.24
(58) Field of Search .................... 365/185.2, 185.24, 365/185.25

(56) References Cited

U.S. PATENT DOCUMENTS 5,365,486 A * 11/1994 Schreck ................. 365/185.22
6,169,691 B1 * 1/2001 Pasotti et al. .......... 365/185.25

* cited by examiner

Primary Examiner—Son Mai
(74) Attorney, Agent, or Firm—Finnegan, Henderson, Farabow, Garrett & Dunner, L.L.P.

(57) ABSTRACT

A method for determining the necessity for refreshing memory cells of a flash memory that includes providing a first reference memory cell, measuring a current of the first reference memory cell, providing a second reference memory cell, measuring a current of the second reference memory cell, measuring a cell current of one of the memory cells of the flash memory, comparing the measured cell current to the current of the first reference memory cell, comparing the measured cell current to the current of the second reference memory cell, and refreshing the memory cell when the measured cell current is greater than the current of the first reference memory cell but less than the current of the second reference memory cell.

8 Claims, 1 Drawing Sheet

SENSING METHOD FOR EEPROM REFRESH SCHEME

FIELD OF THE INVENTION

This invention relates in general to a non-volatile memory device and, more particularly, to a method for sensing memory cells in a non-volatile memory device to determine whether they need to be refreshed.

BACKGROUND OF THE INVENTION

A non-volatile memory is a type of memory that retains stored data even after power has been turned off. An electrically-erasable-programmable read-only-memory (EEPROM) is a type of non-volatile memory wherein data may be repeatedly programmed into and erased from the memory. However, an EEPROM can only be programmed one byte at a time. A flash memory is a type of EEPROM, but unlike an EEPROM, a flash memory can be programmed and erased in blocks, such an entire row of flash memory cells in the memory array. This makes the erase and programming cycles of a flash memory shorter than EEPROMs. In recent years, flash memories have replaced EEPROMs in many applications, and become popular for computer and wireless applications, because of their speed and relative low-cost over EEPROMs.

Most flash memory cells include a floating gate. When a floating gate flash memory is programmed, electrons are injected into the floating gate through a thin oxide layer disposed between the floating gate and the substrate of the flash memory. The process of injecting electrons into the floating gate is generally accomplished by hot electron injection or Fowler-Nordheim tunneling.

Hot electron injection is accomplished by applying a high voltage to the control gate of the memory cell and a low voltage to the drain. Injection occurs when electrons traveling in a channel region between the source and the drain of the memory cell attain a level of energy higher than the barrier potential of the thin oxide layer. The electrons pass through the thin oxide layer and are injected into the floating gate, charging the floating gate. For Fowler-Nordheim tunneling, electrons tunnel through the thin oxide layer to the floating gate when a high voltage is applied to the control gate and a low voltage is applied to the drain.

After electrons are stored in the floating gate, an electric field appears on the channel region below the floating gate. This voltage is known as the threshold voltage of the memory cell. A conventional memory cell stores data by varying the threshold voltage of the cell such that a logic value of "0" is represented by setting a high threshold voltage and a logic value of "1" is represented by a low threshold voltage. To detect what datum is stored in a memory cell, sensing circuits, or sense amplifiers, are commonly used in non-volatile memory devices.

A common undesired effect in programming of a flash memory is "write disturb." As described above, when a flash memory is programmed, or written, high voltages are applied to the memory cells that are to be programmed to induce injection of electrons into the respective floating gates of the memory cells. Because these high voltages are provided through bit lines or word lines that also connect other memory cells, the high voltages are also provided to memory cells that are not the target of programming. Although these high voltages alone will not trigger full programming or erasing of these other memory cells, some may be inadvertently and partially programmed, likely if the memory cells have not been programmed already, or erased, likely if the memory cells have already been programmed. This would cause the threshold voltages of these other memory cells to deviate from the predetermined values for logic values.

To address write disturb, a conventional method provides for automatic periodic "refresh" of all of the memory cells, i.e., re-programming of the memory cells, to ensure that the memory cells retain the programmed values. However, such an automatic periodic refresh of memory cells is time consuming and expends unnecessary resources because not all memory cells are subject to write disturb.

SUMMARY OF THE INVENTION

In accordance with the invention, there is provided a method for determining the necessity for refreshing memory cells of a flash memory that includes providing a first reference current, providing a second reference current, measuring a cell current of at least one of the memory cells of the flash memory, comparing the measured cell current to the first reference current, comparing the measured cell current to the second reference current, and refreshing the memory cell when the measured cell current is greater than the first reference current but less than the second reference current, wherein the first reference current represents a low memory cell logic value, and the second reference current represents a high memory cell logic value.

In one aspect, the memory cell possesses a low logic value if the measured cell current is less than the first reference current.

In another aspect, the memory cell possesses a high logic value if the measured cell current is greater than the second reference current.

Also in accordance with the present invention, there is provided a method for determining the necessity for refreshing memory cells of a flash memory that includes providing a first reference memory cell, measuring a current of the first reference memory cell, providing a second reference memory cell, measuring a current of the second reference memory cell, measuring a cell current of one of the memory cells of the flash memory, comparing the measured cell current to the current of the first reference memory cell, comparing the measured cell current to the current of the second reference memory cell, and refreshing the memory cell when the measured cell current is greater than the current of the first reference memory cell but less than the current of the second reference memory cell.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

The accompanying drawing, which is incorporated in and constitute a part of this specification, illustrate an embodiment of the invention and together with the description, serve to explain the principles of the invention.

DESCRIPTION OF THE EMBODIMENTS

Figure 1:
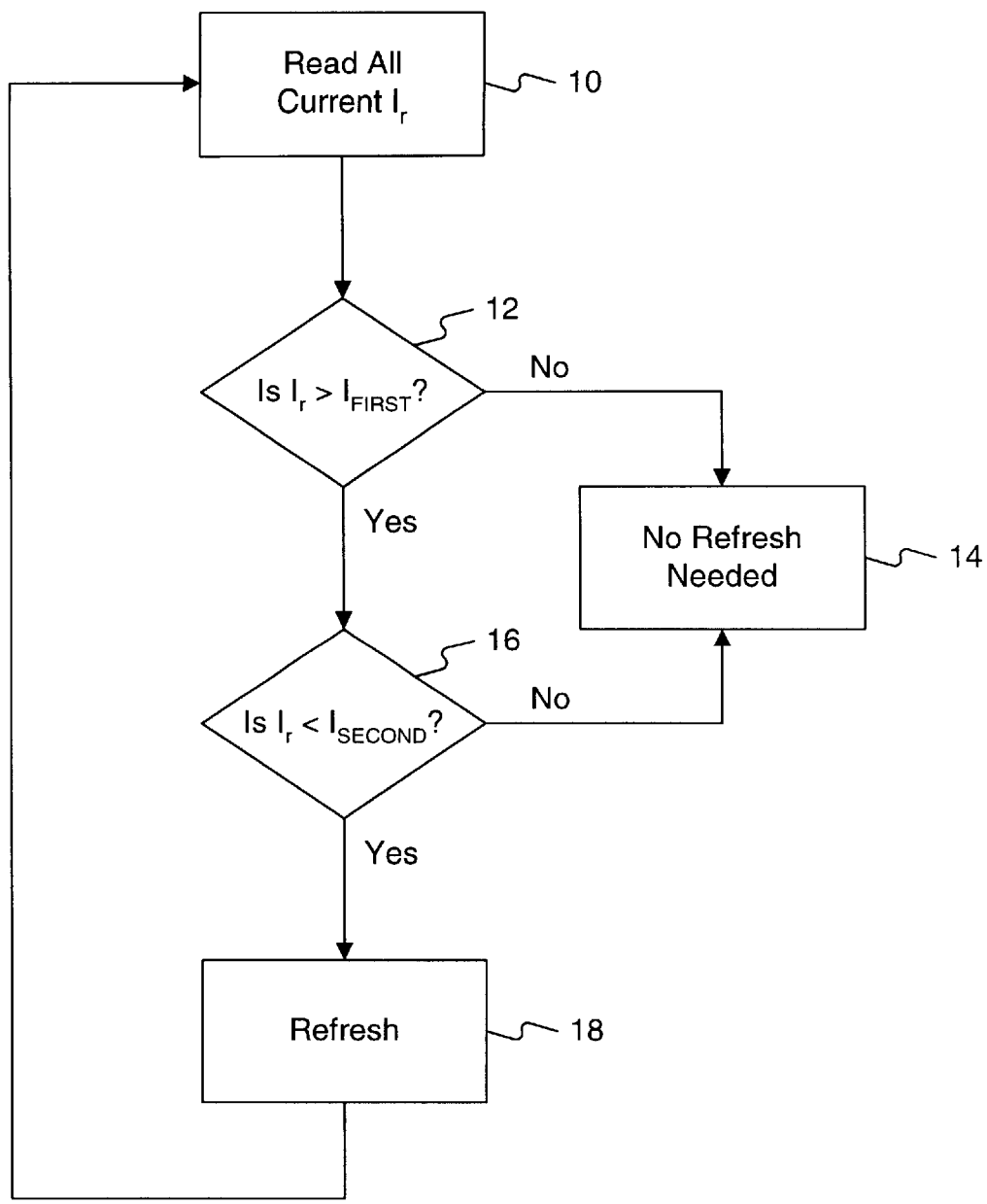
FIG. 1 is a flow chart consistent with one method of the present invention.

Reference will now be made in detail to the present embodiment of the invention, an example of which is illustrated in the accompanying drawing.

The present invention provides a method for determining whether a refresh operation of memory cells of a flash memory is necessary by measuring the current of the memory cells and comparing the current to predetermined values. Only when the measured current indicates that data in certain memory cells need to be rewritten would the refresh operation be performed, thereby providing a saving of time and resources over automatic refresh of memory cells.

The present invention provides two reference memory cells, a first memory cell and a second memory cell. The first memory cell is programmed with a low logic value and the second memory cell is programmed with a high logic value. These two memory cells are isolated from the memory array of the flash memory such that the values of the two reference memory cells cannot be disturbed by the programming and erasing operations of the flash memory. In addition, the values of the two reference memory cells may be set during the manufacturing process consistent with the operations of a sensing amplifier. The first memory cell may be programmed to provide a first current $I_{FIRST}$ and the second memory cell may be programmed to provide a second current $I_{SECOND}$. As an example, the first current has a value of 1 $\mu A$ with a corresponding voltage of 4.9 V and the second current has a value of 30 $\mu A$ with a corresponding voltage of 6.5 V.

FIG. 1 is a flow chart consistent with one method of the present invention. Referring to FIG. 1, the method of the present invention begins by measuring a cell current $I_r$ of a memory cell at step 10. The cell current $I_r$ may be measured using conventional methods, such as one with the aid of a sensing amplifier. The cell current $I_r$ is then first compared to the first current $I_{FIRST}$ at step 12 to determine if the cell current $I_r$ is greater than the first current $I_{FIRST}$. If the value of the measured cell current $I_r$ is not greater than the first current $I_{FIRST}$, the cell current $I_r$ is within the programmed value and the memory cell possesses a low logic value. The memory cell at issue thus does not need to be refreshed, and, as shown in step 14, no action needs to be taken. If, however, the cell current $I_r$ is greater than the first current $I_{FIRST}$, an additional comparison is performed at step 16.

Referring to step 16, the cell current $I_r$ is compared to the second current $I_{SECOND}$ to determine whether the cell current $I_r$ is less than the second current $I_{SECOND}$. If the value of the measured cell current $I_r$ is greater than the second current $I_{SECOND}$, the cell current $I_r$ is within the programmed value and the memory cell possesses a high logic value. Likewise, the memory cell at issue does not need to be refreshed, and no action needs to be taken as referred to in step 14. If, however, the cell current $I_r$ is greater than the first current $I_{FIRST}$ but less than the second current $I_{SECOND}$, the memory cell at issue is programmed with neither a high logic value nor a low logic value. In all likelihood, this indicates write disturb and the memory cell is refreshed at step 18. The method of the present invention continues for the other memory cells in the memory array.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method for determining the necessity for refreshing memory cells of a flash memory, comprising:

providing a first reference current;

providing a second reference current;

measuring a cell current of at least one of the memory cells of the flash memory;

comparing the measured cell current to the first reference current;

comparing the measured cell current to the second reference current; and refreshing the memory cell when the measured cell current is greater than the first reference current but less than the second reference current, wherein the first reference current represents a low memory cell logic value, and the second reference current represents a high memory cell logic value.

2. The method as claimed in claim 1, wherein the memory cell possesses a low logic value if the measured cell current is less than the first reference current.

3. The method as claimed in claim 1, wherein the memory cell possesses a high logic value if the measured cell current is greater than the second reference current.

4. A method for determining the necessity for refreshing memory cells of a flash memory, comprising:

providing a first reference memory cell;

measuring a current of the first reference memory cell;

providing a second reference memory cell;

measuring a current of the second reference memory cell;

measuring a cell current of one of the memory cells of the flash memory;

comparing the measured cell current to the current of the first reference memory cell;

comparing the measured cell current to the current of the second reference memory cell; and refreshing the memory cell when the measured cell current is greater than the current of the first reference memory cell but less than the current of the second reference memory cell.

5. The method as claimed in claim 4, wherein the first reference memory cell possesses a low logic value.

6. The method as claimed in claim 4, wherein the second reference memory cell possesses a high logic value.

7. The method as claimed in claim 5, wherein the memory cell possesses the low logic value if the measured cell current is less than the current of the first reference memory cell.

8. The method as claimed in claim 6, wherein the memory cell possesses the high logic value if the measured cell current is greater than the current of the second reference memory cell.

* * * * *